US012660369B2

(12) United States Patent (10) Patent No.: US 12,660,369 B2
Ishida et al. (45) Date of Patent: Jun. 16, 2026

(54) LIGHT-RECEIVING ELEMENT

(71) Applicant: HAMAMATSU PHOTONICS K.K., Hamamatsu (JP)

(72) Inventors: Hayato Ishida, Hamamatsu (JP); Masaki Hirose, Hamamatsu (JP); Noburo Hosokawa, Hamamatsu (JP); Soh Uenoyama, Hamamatsu (JP); Kazuyoshi Hirose, Hamamatsu (JP); Kazunori Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 326 days.

(21) Appl. No.: 18/265,010

(22) PCT Filed: Sep. 8, 2021

(86) PCT No.: PCT/JP2021/032982
§ 371 (c)(1),
(2) Date: Jun. 2, 2023

(87) PCT Pub. No.: WO2022/130707
PCT Pub. Date: Jun. 23, 2022

(65) Prior Publication Data
US 2024/0030366 A1 Jan. 25, 2024

(30) Foreign Application Priority Data
Dec. 16, 2020 (JP) ................................. 2020-208199

(51) Int. Cl.
H10F 77/40 (2025.01)
H10F 77/30 (2025.01)
(52) U.S. Cl.
CPC ......... H10F 77/413 (2025.01); H10F 77/306 (2025.01)

(58) Field of Classification Search
CPC .. H10F 77/413; H10F 77/306; H10F 39/8063; H10F 39/107; G02B 1/002
See application file for complete search history.

(56) References Cited

U.S. PATENT DOCUMENTS

2008/0011937 A1 1/2008 Toshikiyo
2010/0127156 A1 5/2010 Yokogawa
(Continued)

FOREIGN PATENT DOCUMENTS

EP 4212914 A1 7/2023
JP 2003-248128 A 9/2003
(Continued)

OTHER PUBLICATIONS

International Preliminary Report on Patentability mailed Jun. 29, 2023 for PCT/JP2021/032982.

*Primary Examiner* — Sitaramarao S Yechuri
(74) *Attorney, Agent, or Firm* — Faegre Drinker Biddle & Reath LLP

(57) ABSTRACT

The light detector includes: a substrate including at least one light receiving area and a light incident surface on which light is incident; and a meta-lens formed on the light incident surface of the substrate to focus the light incident on the light incident surface. When viewed from the thickness direction (Z-axis direction) of the substrate, the meta-lens is formed so as to overlap both an adjacent region adjacent to the light receiving area and a peripheral region that is continuous with the adjacent region and is a region inside the light receiving area along the outer edge of the light receiving area. When viewed from the Z-axis direction, a non-forming region in which the meta-lens is not formed is provided in a region overlapping a central region of the light receiving area in the light incident surface.

13 Claims, 14 Drawing Sheets

(56)           References Cited

U.S. PATENT DOCUMENTS

| | | | |
|---|---|---|---|
| 2014/0263982 A1 | 9/2014 | Shkunov et al. | |
| 2016/0064435 A1* | 3/2016 | Yabuki | H10F 39/8067 |
| | | | 438/70 |
| 2018/0130914 A1 | 5/2018 | Kautzsch et al. | |
| 2019/0033683 A1 | 1/2019 | Ahmed et al. | |
| 2019/0044003 A1 | 2/2019 | Heck et al. | |
| 2019/0115483 A1 | 4/2019 | Steveler et al. | |
| 2019/0221602 A1* | 7/2019 | Komai | H10F 39/8063 |
| 2020/0295069 A1* | 9/2020 | Sulfridge | H10F 39/18 |

FOREIGN PATENT DOCUMENTS

| | | |
|---|---|---|
| JP | 2010-161321 A | 7/2010 |
| JP | 2017-162986 A | 9/2017 |
| JP | 2019-075562 A | 5/2019 |
| KR | 10-2143535 B1 | 8/2020 |
| TW | 201725341 A | 7/2017 |

* cited by examiner (A)

(B)

(A)

(B)

(A)

(B)

(C)

LIGHT-RECEIVING ELEMENT

TECHNICAL FIELD

The present disclosure relates to a light detector.

BACKGROUND ART

A configuration in which a grating structure that is a refractive-index modulation structure is provided on a light incident surface of a light sensor substrate including a light receiving area is known (for example, see Patent Document 1). The grating structure described in Patent Document 1 is provided in a surrounding region that does not overlap the light receiving area when viewed from a thickness direction of the light sensor substrate in the light incident surface, and is not provided in a region that overlaps the light receiving area when viewed from the thickness direction.

CITATION LIST

Patent Document

Patent Document 1: US Patent Application Publication No. 2018/0130914

SUMMARY OF INVENTION

Technical Problem

In the above-described configuration described in Patent Document 1, light incident on the surrounding region is focused on the light receiving area by the grating structure, thereby improving the light focusing efficiency. On the other hand, in the above-described configuration, the grating structure is not formed in the entire region overlapping the light receiving area when viewed from the thickness direction of the light sensor substrate. That is, when viewed from the thickness direction of the light sensor substrate, an opening region in which the grating structure is not formed includes the entire light receiving area. When the light to be analyzed includes a component (oblique incident light) obliquely incident on the light incident surface, there is a possibility that many components of the oblique incident light passing through the opening region escape to the outside of the light receiving area as they are. Therefore, in the configuration described in Patent Document 1, there is room for improvement in improving the light focusing efficiency to the light receiving area at least with respect to such oblique incident light.

Therefore, an object of the present disclosure is to provide a light detector capable of further improving light focusing efficiency to a light receiving area.

Solution to Problem

A light detector according to an aspect of the present disclosure includes: a substrate including at least one light receiving area and a light incident surface on which light is incident; and a meta-lens formed on the light incident surface of the substrate so as to focus the light incident on the light incident surface. When viewed from a thickness direction of the substrate, the meta-lens is formed to overlap both an adjacent region adjacent to the light receiving area and a peripheral region that is continuous with the adjacent region and is a region inside the light receiving area along an outer edge of the light receiving area. When viewed from the thickness direction, a non-forming region in which the meta-lens is not formed is provided in a region overlapping a central region of the light receiving area in the light incident surface.

According to the light detector, since the meta-lens is formed in the adjacent region, it is possible to suitably guide light incident on the adjacent region to the light receiving area. In addition, since the non-forming region is formed, incident light traveling straight from a front side of the light receiving area toward the light receiving area may be incident on the light receiving area without passing through the meta-lens. Therefore, it is possible to suppress the optical loss caused by the light passing through the meta-lens. In addition, the meta-lens is also formed in the peripheral region overlapping with the edge of the light receiving area. Thus, even when the light to be analyzed includes oblique incident light that is obliquely incident on the light incident surface, a component of the oblique incident light that is incident on the meta-lens provided in the peripheral region can be suitably guided to the light receiving area. As described above, the light focusing efficiency to the light receiving area can be further improved.

The meta-lens may be configured by a plurality of convex portions periodically arranged. According to the above configuration, the meta-lens can have a physically robust structure.

The meta-lens may be configured by a plurality of concave portions periodically arranged. According to the above configuration, the meta-lens can be made to have a more physically robust structure. Further, each of the plurality of concave portions may be filled with a dielectric. According to the above configuration, the meta-lens can be made to have a physically robust structure more effectively, and the surface reflectance of the meta-lens can be reduced. Accordingly, it is possible to further improve light focusing efficiency to the light receiving area.

The meta-lens may be formed to overlap at least a first peripheral region and a second peripheral region facing each other in one direction perpendicular to the thickness direction among the peripheral region. According to the above configuration, the light focusing efficiency can be improved one-dimensionally at least in the one direction.

The meta-lens may be formed to overlap an entire annular peripheral region formed over an entire circumference of the light receiving area. According to the above configuration, it is possible to improve two-dimensionally the light focusing efficiency.

A width of the non-forming region may be set in a range in which a main lobe of light incident on the non-forming region is included in the light receiving area, based on a spread width due to diffraction of the light incident on the non-forming region. As the width of the non-forming region is reduced, the spread width of light incident on the non-forming region due to diffraction increases. According to the above configuration, since the width of the non-forming region is set in a range in which the main lobe of the light in which the diffraction spread occurs is included in the light receiving area, it is possible to make most of the light (main lobe) incident on the non-forming region incident on the light receiving area. As a result, the light focusing efficiency can be effectively improved.

An antireflection film may be provided in the non-forming region. According to the above configuration, it is possible to suppress reflection loss of incident light at the interface between the light incident surface and the external environment (for example, air).

The substrate may include: a first substrate having a first surface provided with the light receiving area and a second surface opposite to the first surface; and a second substrate bonded to the second surface of the first substrate via an adhesive resin layer and supporting the first substrate. The light incident surface may be constituted by a surface located on an opposite side of the first substrate in the second substrate. Further, the first substrate may be a silicon substrate, and the second substrate may be a glass substrate. According to the above configuration, the substrate is configured by the first substrate in which the light receiving unit is provided and the second substrate that supports the first substrate, and thus it is possible to appropriately secure the strength of the substrate.

An antireflection film may be provided between the first substrate and the second substrate. According to the above configuration, it is possible to suppress reflection loss of incident light at the interface between the first substrate and the second substrate.

A meta-lens layer may be provided between the first substrate and the second substrate. According to the above configuration, the incident light directed toward the light receiving area is further focused at the interface between the first substrate and the second substrate, so that the light focusing efficiency can be further improved.

The substrate may be formed of a single substrate member having a first surface provided with the light receiving area and a second surface opposite to the first surface, and the light incident surface may be constituted by the second surface. According to the above configuration, it is possible to obtain the above-described effect of improving the light focusing efficiency while simplifying the structure of the light detector.

Advantageous Effects of Invention

According to an aspect of the present disclosure, it is possible to provide a light detector capable of further improving light focusing efficiency to a light receiving area.

Figure 1:
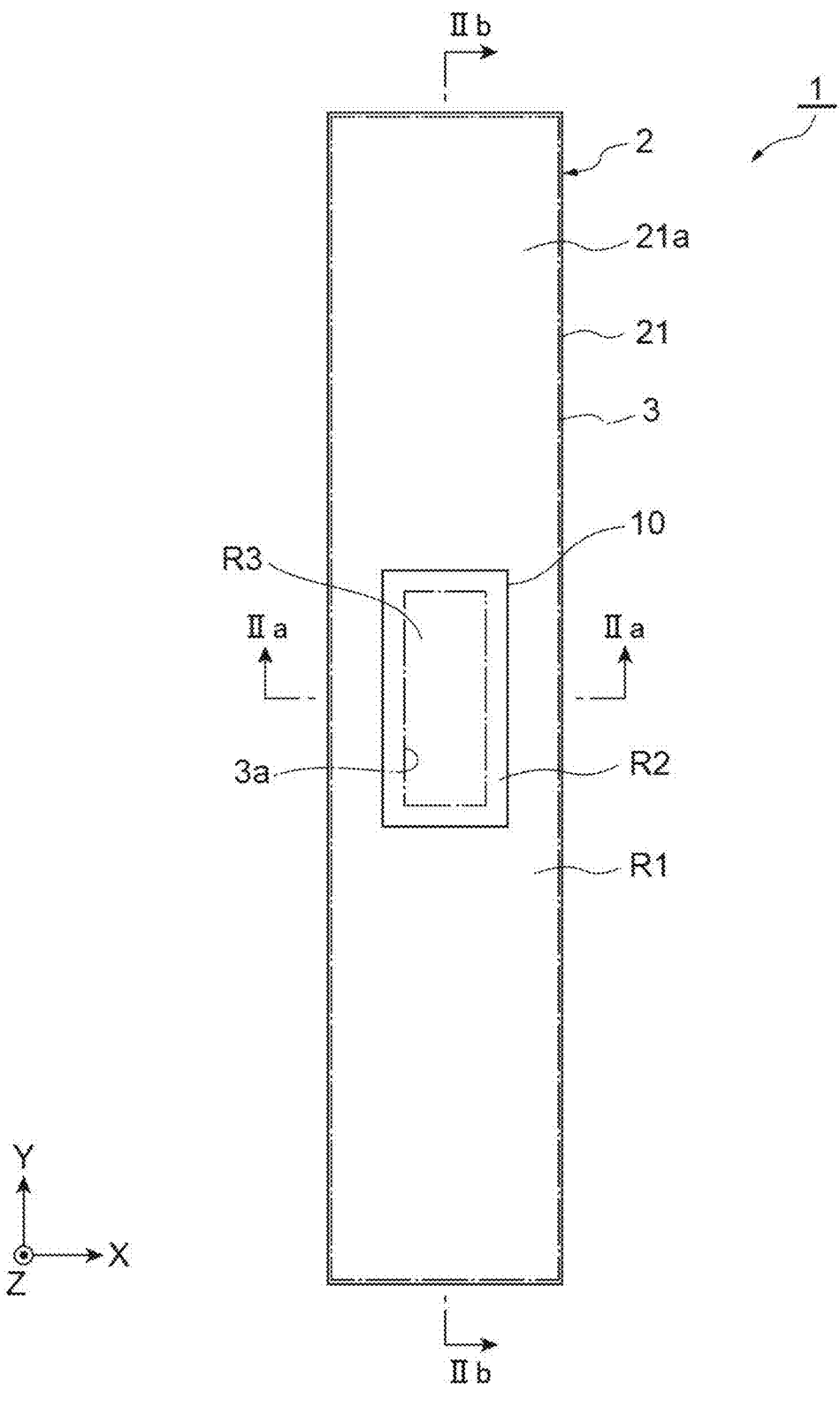
FIG. 1 is a plan view of a light detector according to an embodiment of the present disclosure.
Figure 2:
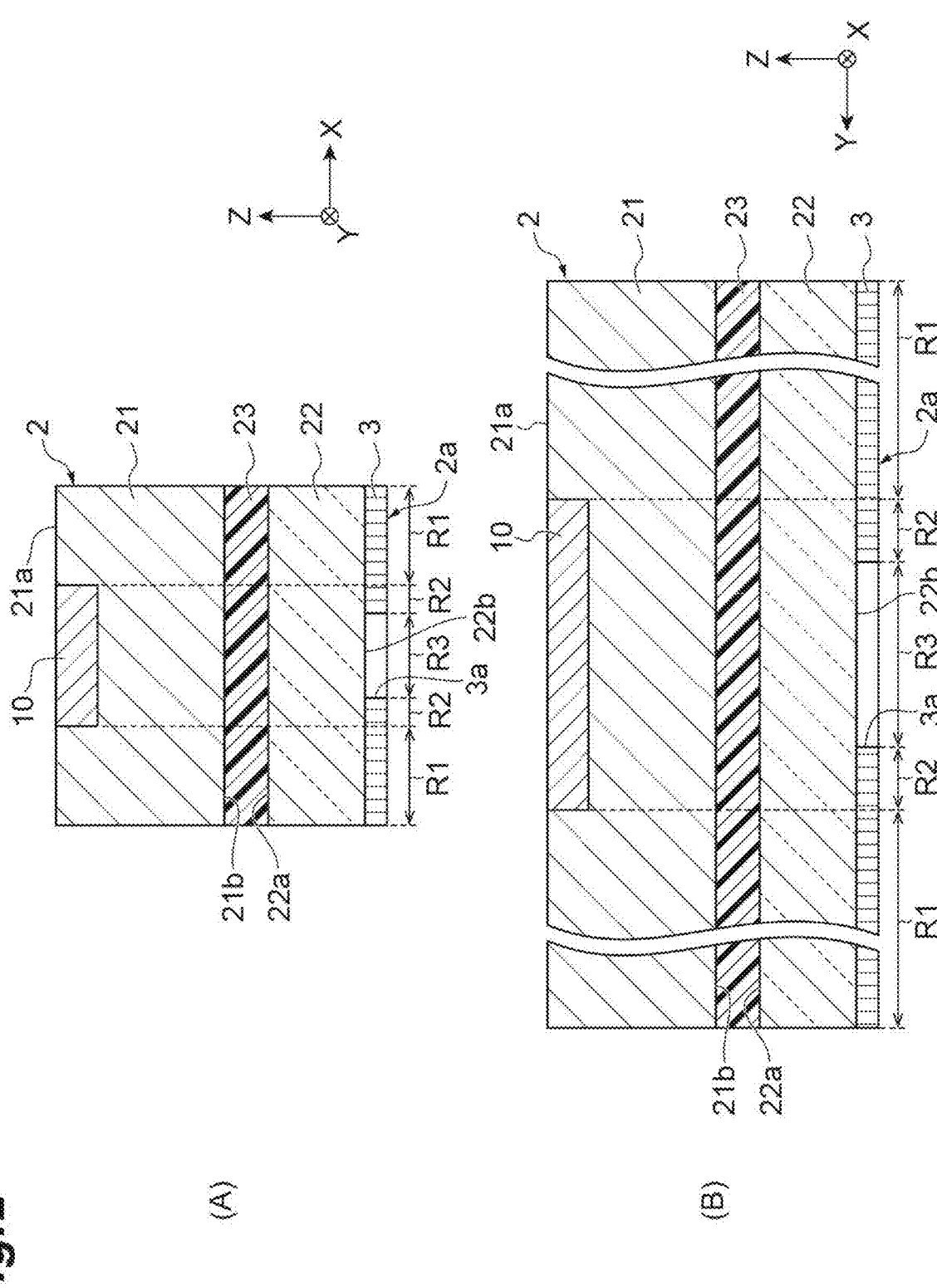

(A) of FIG. 2 is a cross-sectional view taken along line IIa-IIa of FIG. 1, and (B) of FIG. 2 is a cross-sectional view taken along line IIb-IIb of FIG. 1.

Figure 3:
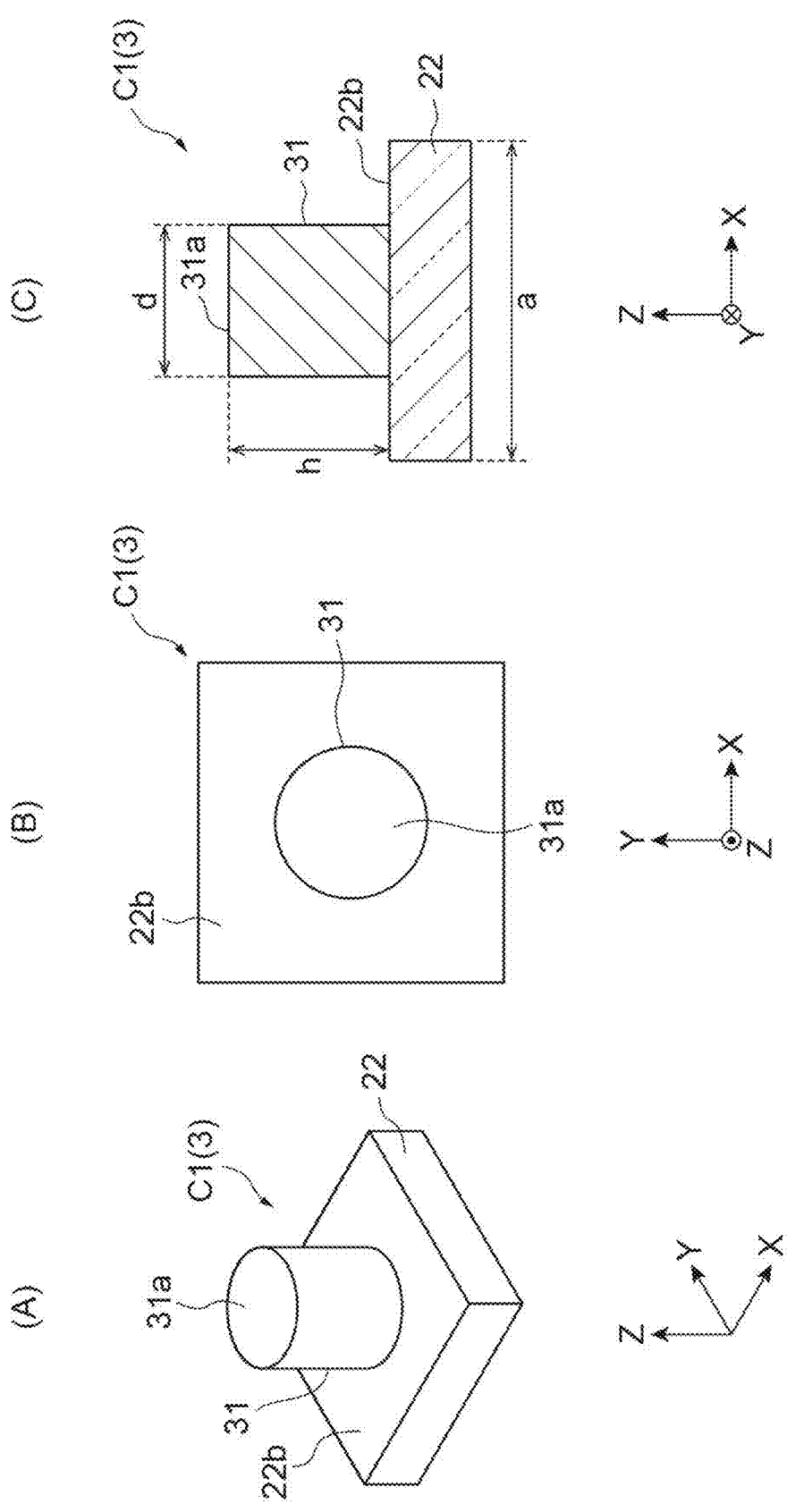

FIG. 3 is a diagram illustrating a basic configuration (unit cell) of a meta-lens.

Figure 4:
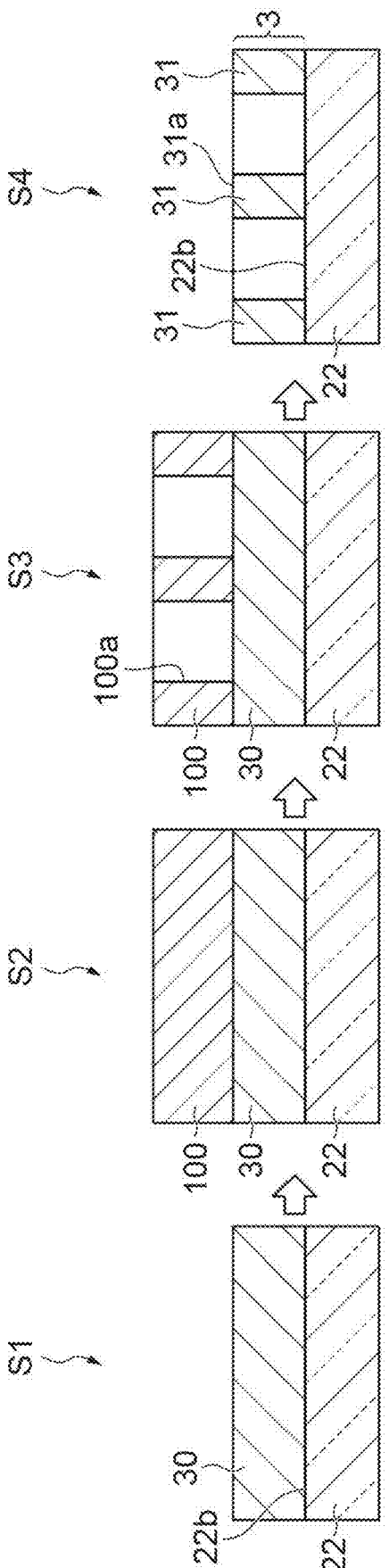

FIG. 4 is a diagram illustrating a process of manufacturing the meta-lens.

Figure 5:
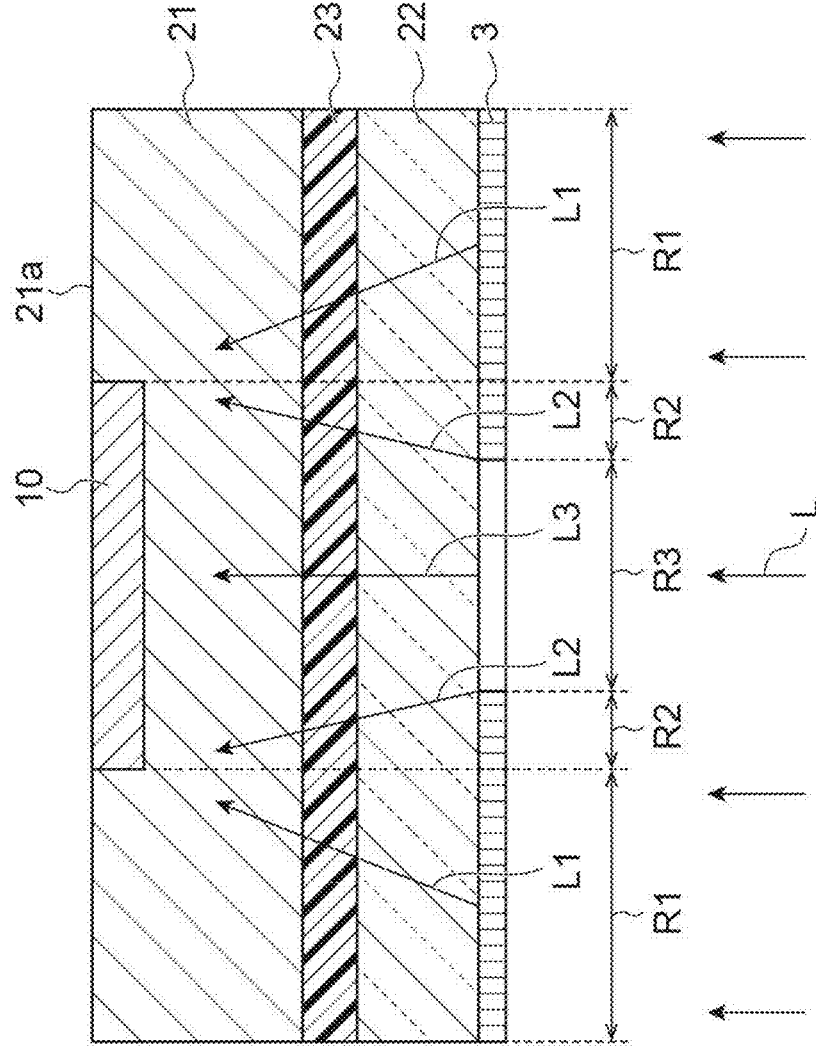

FIG. 5 is a diagram for explaining an effect of the light detector.

Figure 6:
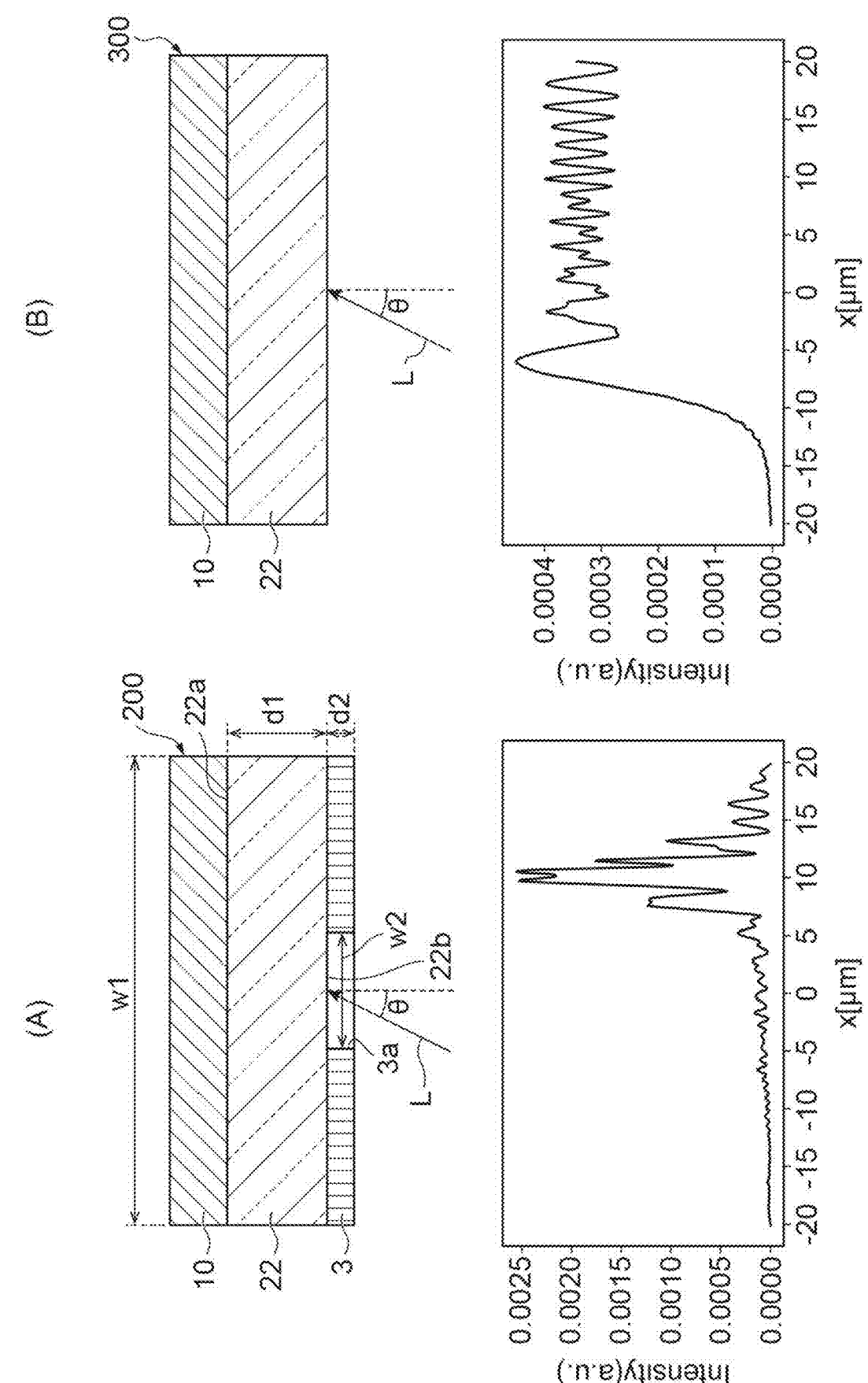

FIG. 6 is a diagram for explaining light focusing efficiency of oblique incident light in an example and a comparative example.

Figure 7:
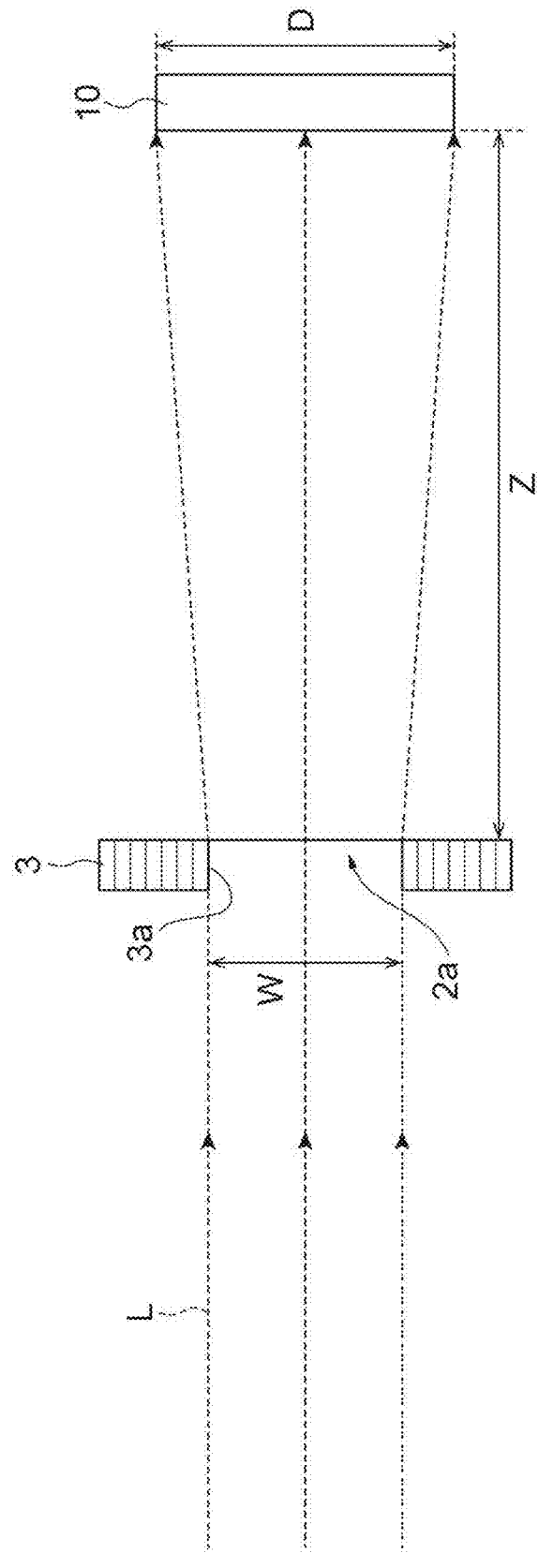

FIG. 7 is a diagram for explaining diffraction spread in an opening of the meta-lens.

Figure 8:
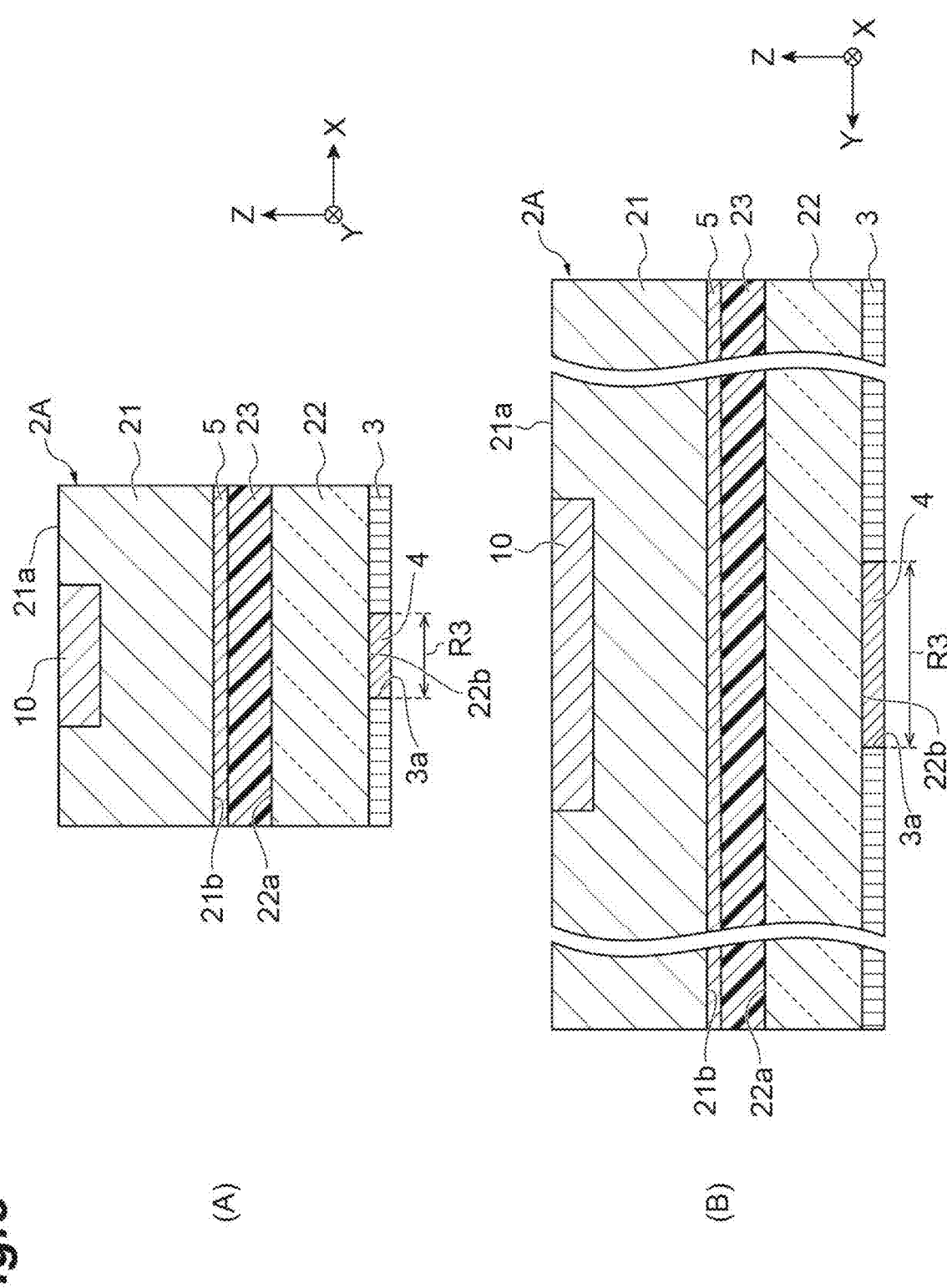

FIG. 8 is a diagram illustrating a first modification example of a substrate included in the light detector.

Figure 9:
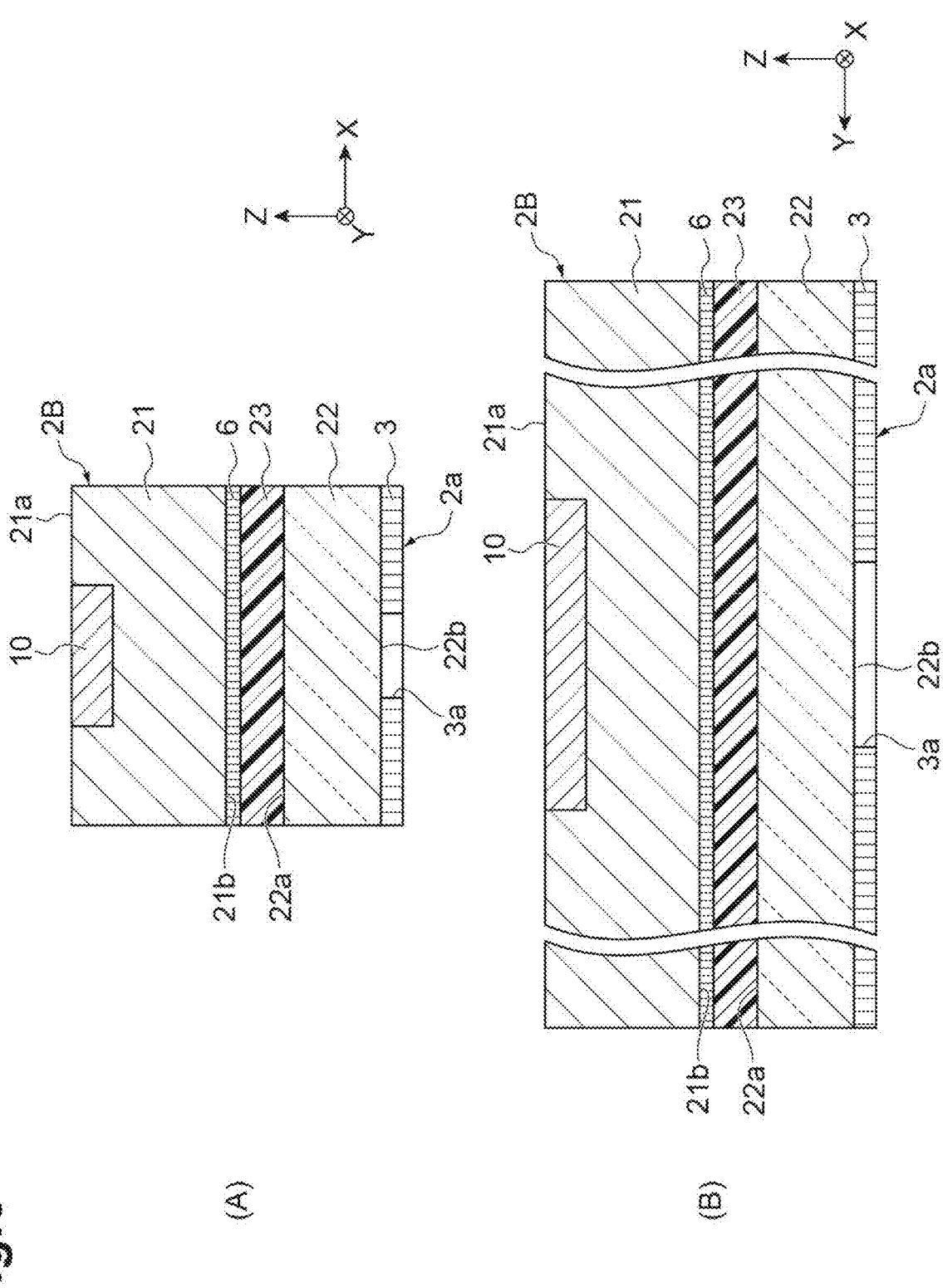

FIG. 9 is a diagram illustrating a second modification example of a substrate included in the light detector.

Figure 10:
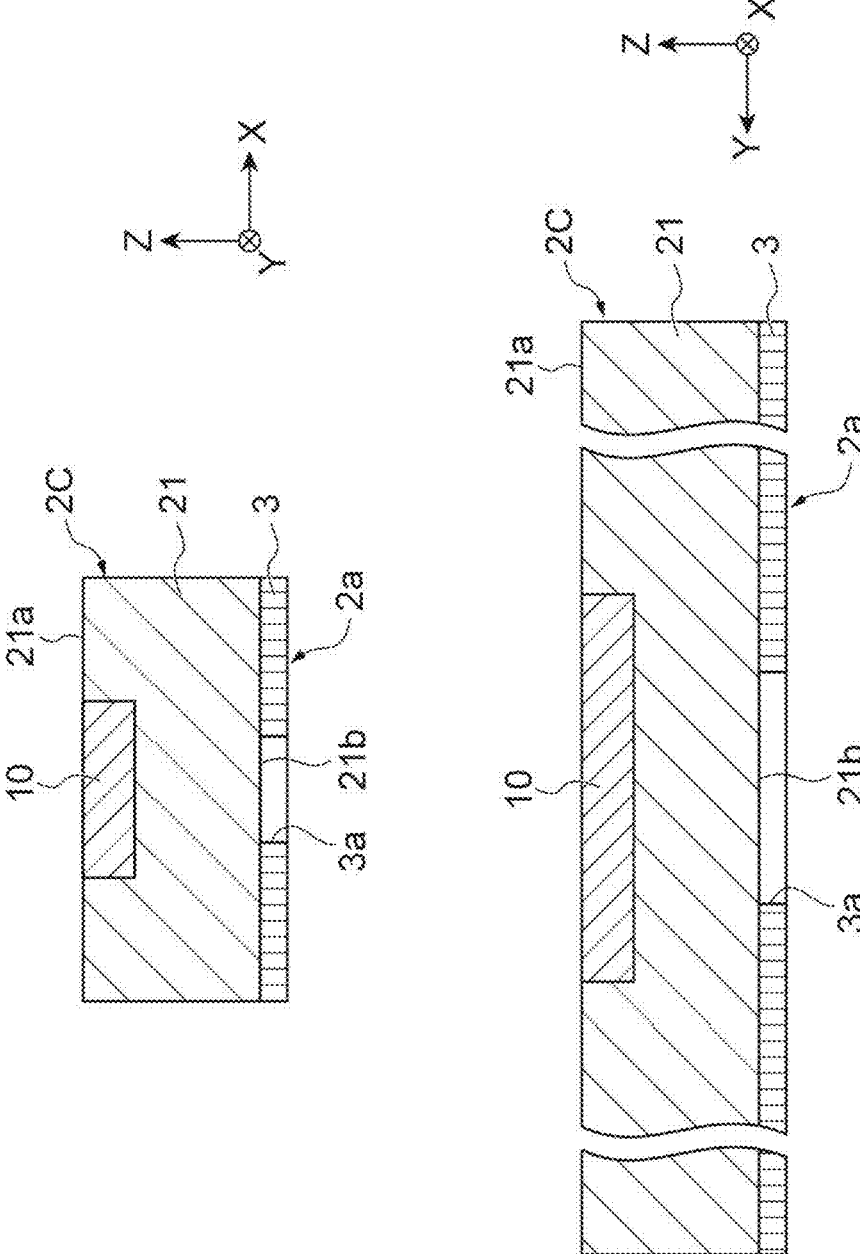

FIG. 10 is a diagram illustrating a third modification example of a substrate included in the light detector.

Figure 11:
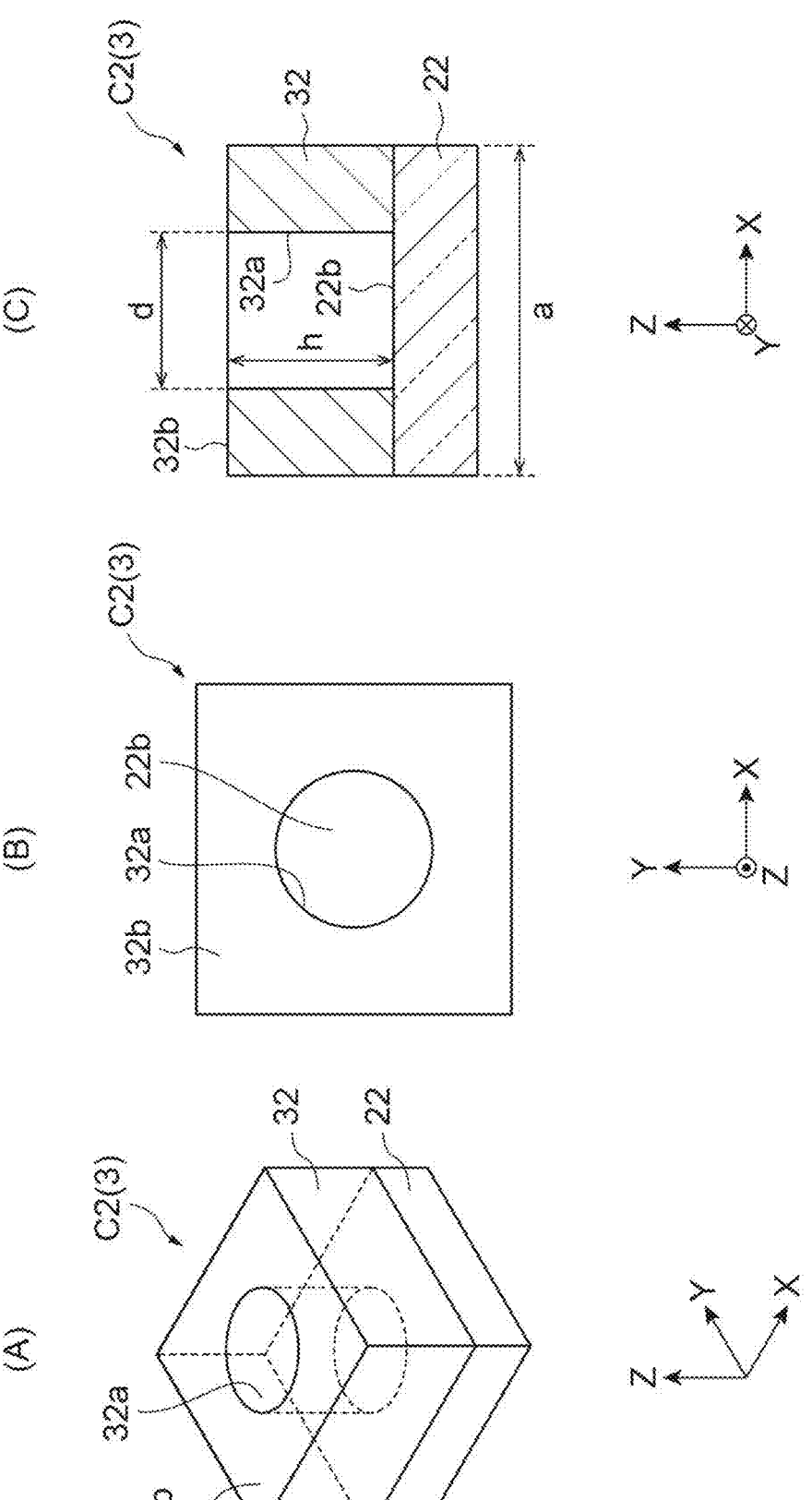

FIG. 11 is a diagram illustrating a first modification example of the basic configuration of the meta-lens.

Figure 12:
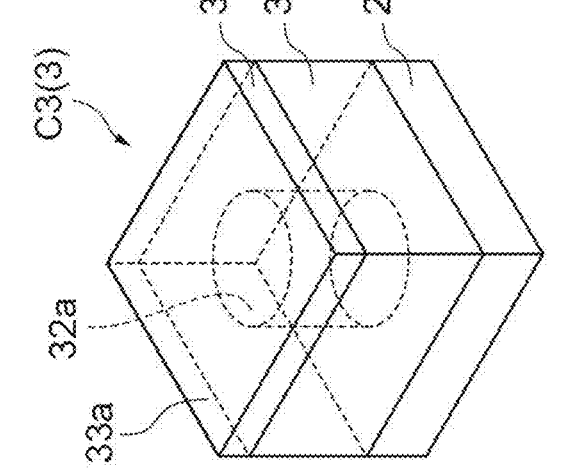
Figure 12:
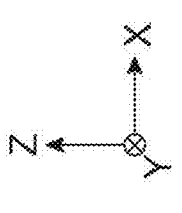
Figure 12:
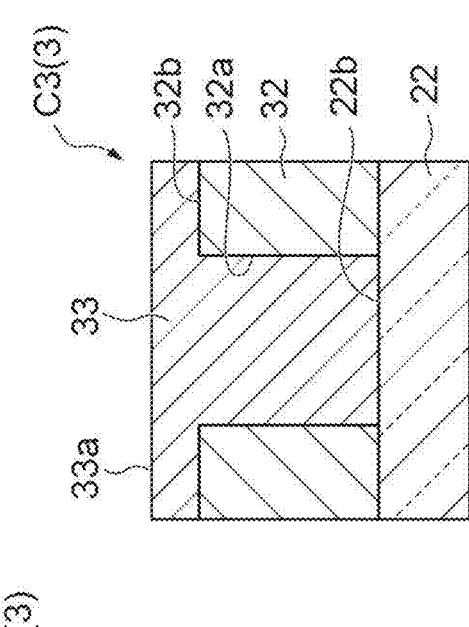
Figure 12:
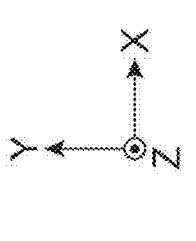
Figure 12:
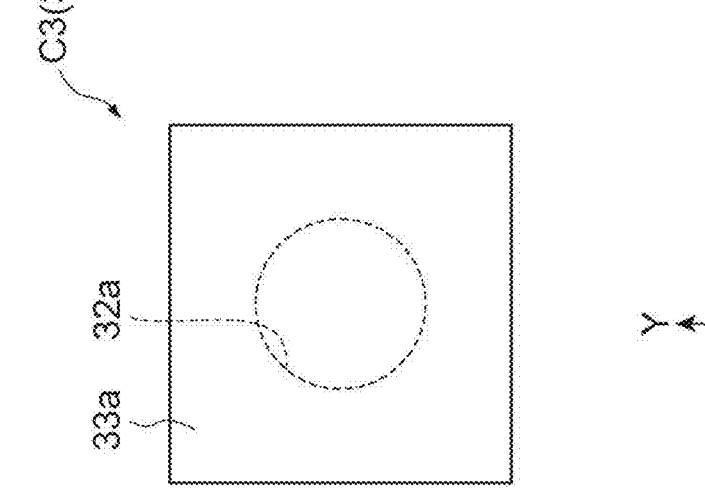
Figure 12:
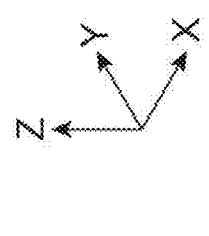

FIG. 12 is a diagram illustrating a second modification example of the basic configuration of the meta-lens.

Figure 13:
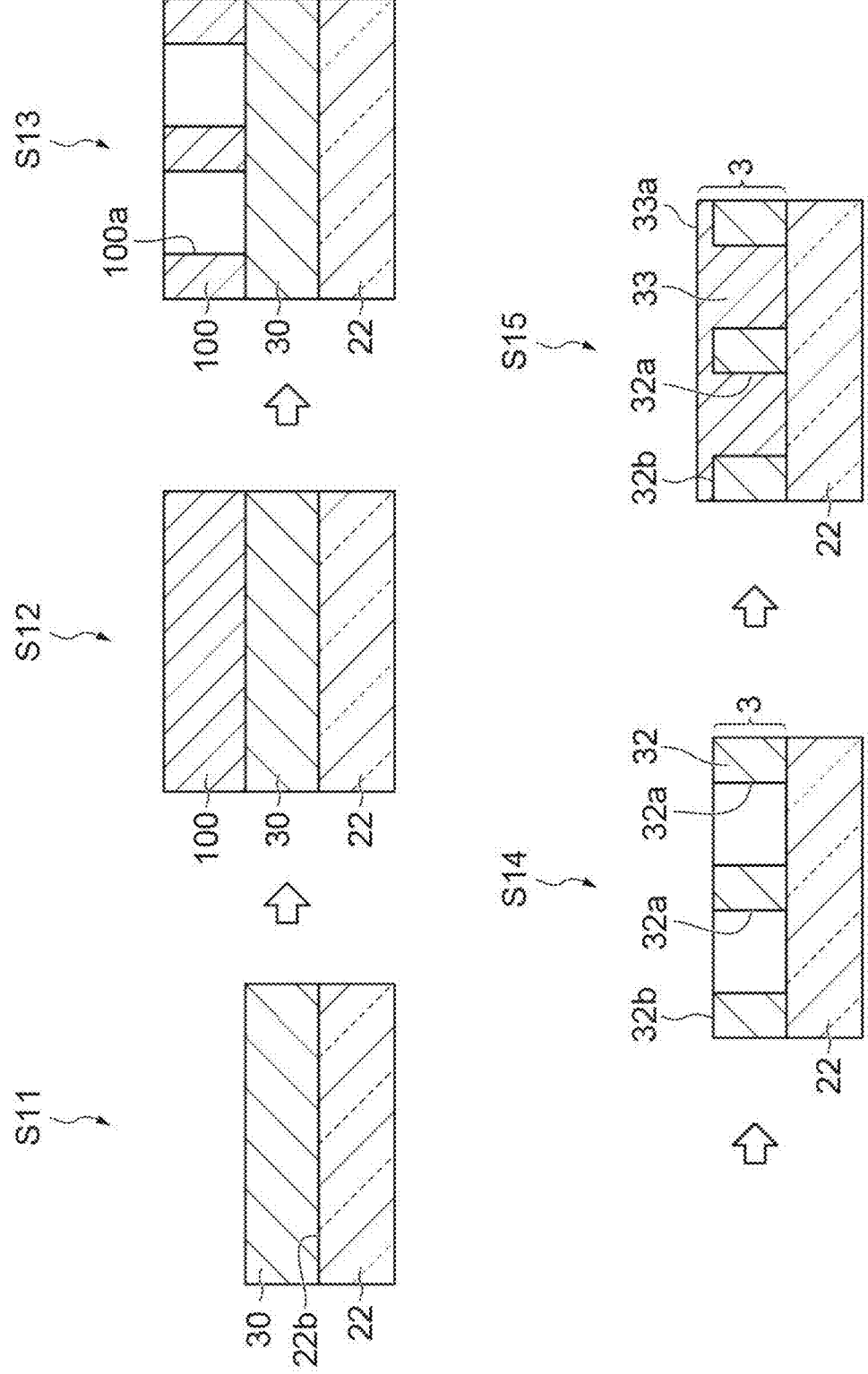

FIG. 13 is a diagram illustrating a process of manufacturing the meta-lens having the basic configuration of the first modification example and the second modification example.

Figure 14:
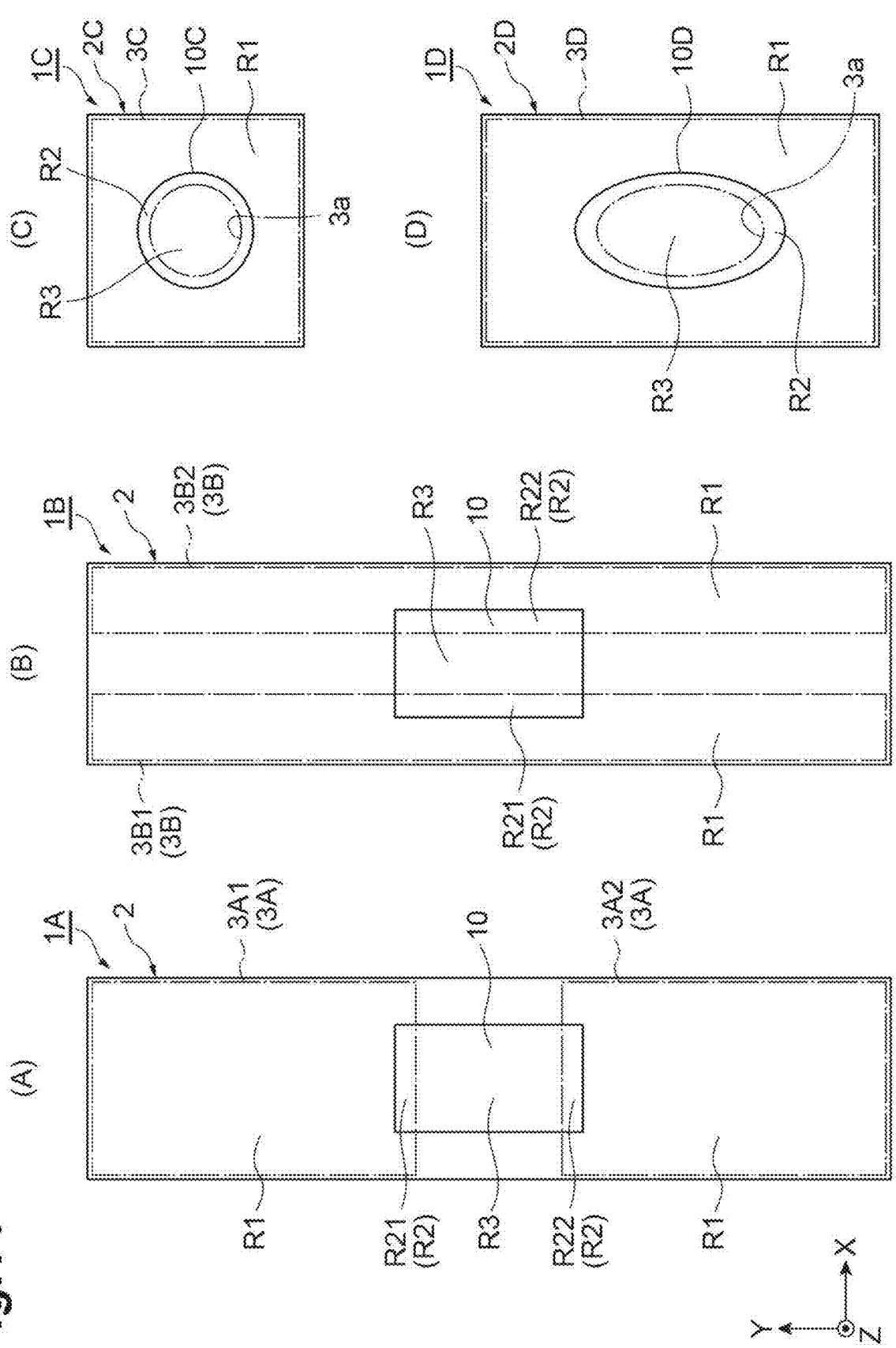

FIG. 14 is a diagram illustrating a first modification example to a fourth modification example of the light detector.

DESCRIPTION OF EMBODIMENTS

Hereinafter, embodiments of the present invention will be described in detail with reference to the drawings. In the drawings, the same or corresponding portions are denoted by the same reference numerals, and redundant description is omitted.

[Configuration of Light Detector According to Embodiment]

As shown in FIGS. 1 and 2, the light detector 1 includes a substrate 2 and a meta-lens 3. In the present embodiment, as an example, the light detector 1 is an elongated light receiving sensor including a light receiving area 10 corresponding to one pixel. However, the light detector 1 may include a plurality of light receiving areas 10 corresponding to a plurality of pixels. For example, the light detector 1 may have a structure in which a plurality of unit structures (substrate 2) corresponding to one pixel illustrated in FIG. 1 are one-dimensionally arranged in the X-axis direction or the Y-axis direction, or may have a structure in which a plurality of the unit structures are two-dimensionally (grid-like) arranged in each of the X-axis direction and the Y-axis direction. In FIGS. 1 and 2 and other drawings to be described later, three dimensional orthogonal coordinates including an X axis, a Y axis, and a Z axis are illustrated for convenience of description. The X-axis direction, the Y-axis direction, and the Z-axis direction correspond to a lateral direction, a longitudinal direction, and a thickness direction of the light detector 1 (substrate).

The substrate 2 includes at least one light receiving area 10 and has a light incident surface 2a on which the light to be analyzed is incident. As an example, the substrate 2 is formed in a rectangular plate shape. The substrate 2 is, for example, about 20 μm long in the lateral direction (X-axis direction). The substrate 2 is, for example, about 201.5 μm long in the longitudinal direction (Y-axis direction). The substrate 2 includes a silicon substrate 21 (first substrate) which is a semiconductor substrate provided with the light receiving area 10 and a glass substrate 22 (second substrate) provided with the meta-lens 3.

The silicon substrate 21 has a main surface 21a (first surface) provided with the light receiving area 10 and a back surface 21b (second surface) opposite to the main surface 21a. The silicon substrate 21 is about 10 μm thick (in the Z-axis direction). The glass substrate 22 is bonded to the back surface 21b of the silicon substrate 21 via an adhesive resin layer 23 and supports the silicon substrate 21. The glass substrate 22 has a surface 22a facing the main surface 21a of the silicon substrate 21 and a surface 22b opposite to the surface 22a. The light incident surface 2a of the substrate 2 is constituted by the surface 22b of the glass substrate 22. The glass substrate 22 is, for example, about 300 μm thick (in the Z-axis direction).

As shown in FIG. 1, the light receiving area 10 is provided along the main surface 21a in a substantially central portion of the main surface 21a of the silicon substrate 21. As an example, the light receiving area is formed in a rectangular shape. The lateral direction and the longitudinal direction of the light receiving area 10 coincide with the lateral direction and the longitudinal direction of the substrate 2, respectively. The length of the light receiving area 10 in the lateral direction (X-axis direction) is, for example, about 6.2 μm. The length of the light receiving area 10 in the longitudinal direction (Y-axis direction) is, for example, about 50 μm. The thickness (length in the Z-axis direction) of the light receiving area 10 is, for example, about 3 μm. The meta-lens 3 is formed on the light incident surface 2a of the substrate 2 (in the present embodiment, a surface 22b of the glass substrate 22). The meta-lens 3 is a meta-surface structure that functions as a lens that focuses light incident on the light incident surface 2a. More specifically, the meta-lens 3 is a nanostructure (fine concave-convex structure) in which unit cells C1, which are a basic configuration (unit lattice) illustrated in FIG. 3, are periodically arranged in a lattice shape along the X-axis direction and the Y-axis direction. As an example, the unit cell C1 is a square region when viewed from the Z-axis direction. One pillar 31 (convex portion) having a columnar shape (cylindrical shape as an example in the present embodiment) is formed for each unit cell C1. The pillar 31 is erected on the surface 22b of the glass substrate 22 in the central portion of the unit cell C1. That is, the meta-lens 3 is configured by a plurality of pillars 31 periodically arranged in a lattice pattern. The material of the pillar 31 is silicon, titanium dioxide ($TiO_2$), or the like, for example.

The pitch a of the pillars 31 (i.e., the center-to-center distance between adjacent pillars 31, the length of one side of the unit cell C1) is set to be shorter than a wave length of the light to be analyzed. That is, the meta-lens 3 has a sub-wavelength structure of the light to be analyzed. As an example, when the wave length λ, of the light to be analyzed is 940 nm, the pitch a of the pillar 31 can be set to 400 nm, for example. The height h of the pillar 31 can be selected from the range of 450 nm to 550 nm, for example. The width d (diameter) of the pillar 31 can be selected from the range of 100 nm to 300 nm, for example. As an example, in the entire meta-lens 3 (that is, all the unit cells C1), the heights h of the pillars 31 are set to a constant value (for example, 500 nm). On the other hand, the width d of the pillar 31 of each unit cell C1 is selected from the above-described range according to the arrangement location of each unit cell C1. In this way, by setting the width d of the pillar 31 of each unit cell C1 in accordance with the location of each unit cell C1, the amount of phase modulation is controlled for each location of each unit cell C1, and the meta-lens 3 that functions as a condenser lens is obtained. For example, when viewed from the Z-axis direction, the meta-lens 3 has a structure in which a plurality of regions for one cycle (regions including a plurality of unit cells C1), which are formed such that the phase changes continuously by 2π along a direction from the outside of the meta-lens 3 toward the center (center of a non-forming region R3 described later), are repeatedly arranged along the direction.

The structure of the meta-lens 3 described above will be supplemented. As types of meta-lens structure (metasurface structure), so-called refractive index modulation type and resonance type are known. The meta-lens 3 may have any of the metasurface structures described above. The metasurface structure of the refractive index modulation type is a structure of controlling an effective refractive index determined by a filling rate (occupancy) of a meta-lens material in each of the unit cell C1. The metasurface structure of the resonance type is a structure of controlling phase and transmissivity by adjusting electric resonance and magnetic resonance according to the structure of each unit cell C1 (that is, the shape and size of a nanostructure composed of a plurality of regularly arranged concave-convex structures). More specifically, the resonance type metasurface structure is a structure of realizing the above-described lens function by adjusting a transmittance coefficient t represented by the following Equation (1). In the following Equation (1), $\omega_{e,k}$ represents a resonance frequency related to electric resonance in the k-th order mode, and $\omega_{m,k}$ represents a resonance frequency related to magnetic resonance in the k-th order mode. In addition, ω represents a resonance angular frequency in the Lorentz oscillator model that describes electron polarization. In addition, $\gamma_{e,k}$ represents an attenuation coefficient related to electric resonance of the k-th order mode in the Lorentz oscillator model, and $\gamma_{m,k}$ represents an attenuation coefficient related to magnetic resonance of the k-th order mode in the Lorentz oscillator model. In addition, $a_k$ is a parameter representing the degree of contribution of electric resonance in the k-th order mode in the Lorentz oscillator model, and $b_k$ is a parameter representing the degree of contribution of magnetic resonance in the k-th order mode in the Lorentz oscillator model. The resonance type metasurface structure includes a Huygens type (Nanodisk type) corresponding to a case of "m=n=1" in the following Equation (1) (that is, a case of using resonance of electric dipoles and magnetic dipoles in a single mode) and an HCG type (Micropost type) corresponding to a case other than "m=n=1" in the following Equation (1) (that is, a case of using resonance in a higher order mode). When the meta-lens 30 is configured by the resonance type metasurface structure, any type of the Huygens type and the HCG type described above may be used.

$$t = 1 + \sum_{k=1}^{m} a_k \frac{2i\gamma_{e,k}\omega}{\omega_{e,k}^2 - \omega^2 - 2i\gamma_{e,k}\omega} + \sum_{k=1}^{n} b_k \frac{2i\gamma_{m,k}\omega}{\omega_{m,k}^2 - \omega^2 - 2i\gamma_{m,k}\omega} \qquad \text{(Equation 1)}$$

In a case where the refractive index modulation type is adopted as the structure of the meta-lens 3, it is possible to secure robustness with respect to a change in the wavelength of the light to be analyzed, compared to a case where the resonance type is adopted. On the other hand, when the resonance type is adopted, the phase change can be made sharp and high transmittance can be secured as compared with the refractive index modulation type. In addition, when the Huygens type is adopted, the aspect ratio of the pillar 31 can be reduced (that is, the height of the pillar 31 can be lowered) as compared with the refractive index modulation type and the HCG type, and thus the structure of the meta-lens 3 can be made more robust. On the other hand, when the HCG type is adopted, since it is possible to use resonance of a plurality of higher-order modes, it is possible to increase the degree of freedom of the structural design of the meta-lens 3.

As shown in FIGS. 1 and 2, when viewed from the Z-axis direction (thickness direction of the substrate 2), the meta-lens 3 is formed so as to overlap both an adjacent region R1 adjacent to the light receiving area 10 and a peripheral region R2 that is continuous with the adjacent region R1 and is a region inside of the light receiving area 10 along an outer edge of the light receiving area 10. When viewed from the Z-axis direction, a non-forming region R3 is provided in a region overlapping the central region of the light receiving area 10 in the light incident surface 2a (in the present embodiment, the surface 22b of the glass substrate 22). The non-forming region R3 is a region where the meta-lens 3 is not formed.

In the present embodiment, the meta-lens 3 is formed so as to overlap the entire annular peripheral region R2 formed over the entire circumference of the light receiving area 10. That is, when viewed from the Z-axis direction, the meta-lens 3 has a rectangular annular shape in which a rectangular opening 3*a* corresponding to the non-forming region R3 is formed in the central portion. That is, the non-forming region R3 is formed to be slightly smaller than the light receiving area 10 by the peripheral region R2. In other words, when viewed from the Z-axis direction, the non-forming region R3 is completely contained inside the light receiving area 10. In other words, when viewed from the Z-axis direction, the outer edge of the non-forming region R3 is located inside the outer edge of the light receiving area 10 over the entire circumference of the non-forming region R3.

An example of a process of manufacturing the meta-lens 3 will be described with reference to FIG. 4. First, a silicon layer 30 (amorphous silicon) including a portion to be the meta-lens 3 (that is, the plurality of pillars 31) is formed on the surface 22*b* of the glass substrate 22 (quartz substrate) by a sputtering method (step S1). The thickness of the silicon layer 30 is determined based on a design value (for example, a value selected from the range of 450 nm to 550 nm) of the height h of the pillar 31. Subsequently, an electron-beam (EB) resist 100 having a thickness of about 300 nm is applied onto the front side of the silicon layer 30 (the side opposite to the glass substrate 22 side) (step S2). Subsequently, a pattern designed in advance is EB drawn on the EB resist 100 by the EB lithography method (step S3). In detail, openings 100*a* corresponding to a non-forming region R3 and a portion in which the pillar 31 is not formed in each unit cell C1 included in the adjacent region R1 and the peripheral region R2 are formed in the EB resist 100. In the present embodiment (example of FIG. 1), the EB drawing region is a rectangular region having a short side of 20 μm and a long side of 201.5 μm. Subsequently, etching (for example, dry etching such as inductively coupled plasma (ICP-RIE) etching) using the EB resist 100 as a mask is performed to remove a portion (that is, an exposed portion) of the silicon layer 30 corresponding to the opening 100*a* of the EB resist 100. Thereafter, the EB resist 100 is stripped (step S4). As described above, the meta-lens 3 (that is, a structure in which the plurality of pillars 31 are periodically arranged) is formed on the surface 22*b* of the glass substrate 22.

[Effects of Light Detector According to Embodiment]

The effect of the light detector 1 described above will be described with reference to FIG. 5. As shown in FIG. 5, since the meta-lens 3 is formed in the adjacent region R1, the light L1 incident on the adjacent region R1 can be suitably guided to the light receiving area 10. For example, in the adjacent region R1, the meta-lens 3 changes the traveling direction of the light L1 traveling straight in the direction orthogonal to the light incident surface 2*a* (that is, the light proceeding to the outside of the light receiving area 10) to the light receiving area 10 side, so that the light L1 can be incident on the light receiving area 10. In addition, since the non-forming region R3 is formed, incident light (light L3) traveling straight from the front side of the light receiving area toward the light receiving area 10 may be incident on the light receiving area 10 without passing through the meta-lens 3. Therefore, it is possible to suppress the optical loss caused by the light L3 passing through the meta-lens 3.

Furthermore, in the light detector 1, the meta-lens 3 is also formed on the peripheral region R2 overlapping with the edge of the light receiving area 10. That is, when viewed from the Z-axis direction, the outer edge of the non-forming region R3 is located inside the outer edge of the light receiving area 10. Thus, even when the light L to be analyzed includes components (obliquely incident light) obliquely incident on the light incident surface 2*a*, the components incident on the meta-lens 3 provided in the peripheral region R2 among the obliquely incident light can be suitably guided to the light receiving area 10.

With reference to FIG. 6, the effect about the oblique incident light will be described in detail. A light detector 200 illustrated in (A) of FIG. 6 is a simulation model having a simple configuration created to verify an effect achieved by forming the meta-lens 3 in the peripheral region R2. In the light detector 200, the light receiving area 10 is formed on the entire surface 22*a* of the glass substrate 22, and the meta-lens 3 described above is formed on the surface 22*b*. An opening 3*a* (opening corresponding to the above-described non-forming region R3) is provided in the center of the meta-lens 3. A region in which the meta-lens 3 is provided in the surface 22*b* corresponds to the peripheral region R2 described above. Here, the refraction index of the glass substrate 22 is "1.51", and the thickness d1 of the glass substrate 22 is 40 μm. Further, the pitch a (see FIG. 3) of the meta-lens 3 is 400 nm, and the height d2 of the meta-lens 3 (i.e., the height of the pillar 31) is 500 nm. In addition, the light detector 200 is formed in a square plate shape having a side w1 of 40 μm. The width w2 (length of the side) of the opening 3*a* is 10 μm. The upper drawing of (A) of FIG. 6 shows one cross section along the thickness direction of the light detector 200 passing through the center of the light receiving area 10 (the center of the opening 3*a*). Here, the light L to be analyzed is light which is inclined with respect to the light incident surface (surface 22*b*) and is incident on the entire light incident surface in the one cross section. The wave length λ, of the light L is 940 nm. The inclination angle θ of the light L with respect to the light incident surface is set to 20 degrees. On the other hand, a light detector 300 illustrated in (B) of FIG. 6 is a simulation model corresponding to the comparative example. The light detector 300 is different from the light detector 200 in that the meta-lens 3 is not formed, and other configurations of the light detector 300 are the same as those of the light detector 200.

The horizontal axis of the graph shown on the lower side of (A) of FIG. 6 represents the distance from the center position of the light detector 200 in the one cross section when the center position is "0" (the distance is represented with the right direction in the drawing as the positive direction and the left direction in the drawing as the negative direction). The vertical axis of the graph represents the intensity of light incident on each position of the light detector 200. The graph shown on the lower side of (B) of FIG. 6 is a graph of the light detector 300 corresponding to the graph of the light detector 200 described above. The following can be seen from these graphs. That is, as shown in the graph shown on the lower side of (B) of FIG. 6, in the light detector 300 in which the meta-lens 3 is not formed, it can be confirmed that the light L escapes to the outside of the light receiving area 10 toward the traveling direction side of the light L (right side in this example). On the other hand, as shown in the graph on the lower side of (A) of FIG. 6, in the light detector 200, it can be confirmed that the peak position of the light amount is located within the light receiving area 10 although the peak position is slightly shifted to the traveling direction side of the light L from the center position of the light receiving area 10. That is, it may be confirmed that most of the components of the light L are efficiently focused in the light receiving area 10 by the meta-lens 3 (i.e., the meta-lens 3 formed on the peripheral region R2). From the above, by forming the meta-lens 3 in the peripheral region R2 overlapping with the edge portion of the light receiving area 10, it is possible to suitably focus the obliquely incident light to the light receiving area 10.

As described above, according to the light detector 1, it is possible to further improve the light focusing efficiency to the light receiving area 10. In addition, for example, in a case where the light detector 1 has a structure in which a plurality of unit structures (substrate 2) for one pixel shown in FIG. 1 are arranged along the X-axis direction, it is possible to suppress occurrence of oblique incident light incident on one pixel (that is, light incident surface 2a corresponding to one light receiving area 10) being incident on a pixel adjacent to the one pixel (so-called crosstalk).

The meta-lens 3 is configured by a plurality of pillars 31 arranged periodically. According to this configuration, the meta-lens 3 can have a physically robust structure.

In addition, as shown in FIG. 5, the light passing through the non-forming region R3 (i.e., the opening 3a of the meta-lens 3) is directed toward the light receiving area 10 while being diffused by the diffraction of the light in the opening 3a. Therefore, if the non-forming region R3 and the light receiving area 10 have the same size and completely overlap each other when viewed from the Z-axis direction, a part of the diffracted light L2 leaks to the outside of the light receiving area 10. On the other hand, in the present embodiment, since the meta-lens 3 is provided in the peripheral region R2, the non-forming region R3 is formed to have a size smaller than the light receiving area 10. Thus, as shown in FIG. 5, the diffracted light L2 that passes through the non-forming region R3 and spreads toward the light receiving area 10 can be appropriately accommodated in the light receiving area 10. In addition, although the light incident on the meta-lens 3 disposed in the peripheral region R2 is somewhat attenuated by the meta-lens 3, the light is guided to the light receiving area 10 by the condensing effect of the meta-lens 3. Therefore, the sensitivity can be improved as compared with the case where the light passes out of the light receiving area 10 due to the spread caused by the opening diffraction described above.

More preferably, the width of the non-forming region R3 (that is, the width (length of one side) of the opening 3a) may be set as follows based on the spread width of the light L incident on the non-forming region R3 due to diffraction. That is, the width of the non-forming region R3 may be set to a range in which the main lobe of the light L incident on the non-forming region R3 is included in the light receiving area 10. This will be described in detail with reference to FIG. 7. As shown in FIG. 7, the spread caused by diffraction in the opening 3a of the meta-lens 3 (the spread of the main lobe of the light L at the position where the light receiving area 10 is provided) is expressed by the following Equation (2). Here, λ represents the wave length of the light L, Z represents the propagation length (i.e., the distance from the light incident surface 2a to the light receiving area 10), n represents a refractive index of the propagation medium, and W represents the opening width (diameter) of the opening 3a. In this embodiment, there are three types of media of a glass substrate 22, an adhesive resin layer 23, and a silicon substrate 21, as propagation media from the light incident surface 2a to the light receiving area 10. In this case, the refractive index n is an average refractive index calculated based on the refractive index and the thickness of each medium.

$$\text{Spread width of the main lobe} = 2\lambda Z/nW \qquad \text{(Equation 2)}$$

Therefore, when the width of the light receiving area 10 is represented by D, by setting the width W of the opening 3a so as to satisfy the following Equation (3), the entire main lobe of the light L incident on the non-forming region R3 can be made incident on the light receiving area 10. As a result, the light focusing efficiency can be effectively improved. FIG. 7 shows a case where an equality sign (=) is satisfied in the following Equation (3) (that is, a case where the width W is set to a lower limit value for focusing the entire main lobe on the light receiving area 10).

$$2\lambda Z/nD \leq W \qquad \text{(Equation 3)}$$

In a case where the non-forming region R3 (opening 3a) is formed in a circular shape instead of a rectangular shape (for example, see (C) of FIG. 14), the above Equations (2) and (3) are replaced by the following Equations (4) and (5). In this case, the width W of the opening 3a means the diameters of the opening 3a. When the non-forming region R3 (opening 3a) has a shape that is neither rectangular nor circular (for example, when the corners of the rectangular shape are rounded), a value (for example, an intermediate value) between the value of the left side of the above Equation (3) and the value of the left side of the following Equation (5) may be used as the lower limit of the opening 3a.

$$\text{Spread width of the main lobe} = 2.44\lambda Z/nW \qquad \text{(Equation 4)}$$

$$2.44\lambda Z/nD \leq W \qquad \text{(Equation 5)}$$

In addition, the meta-lens 3 is formed to overlap the entire annular peripheral region R2 formed over the entire circumference of the light receiving area 10. According to the above configuration, it is possible to improve the light focusing efficiency two-dimensionally. That is, in the present embodiment, the above-described effect of improving the light focusing efficiency is obtained in both the plane along the X-axis direction and the plane along the Y-axis direction.

Further, the substrate 2 includes the silicon substrate 21 having the main surface 21a (first surface) provided with the light receiving area and the back surface 21b opposite to the main surface 21a, and the glass substrate 22 bonded to the back surface 21b of the silicon substrate 21 via the adhesive resin layer 23 and supporting the silicon substrate 21. The light incident surface 2a is constituted by a surface 22b of the glass substrate 22. According to the above-described configuration, the substrate 2 is configured by the first substrate (the silicon substrate 21 in the present embodiment) provided with the light receiving area 10 and the second substrate (the glass substrate 22 in the present embodiment) supporting the first substrate. Thus, the strength of the substrate 2 can be appropriately secured.

[First Modification Example of Substrate]

With reference to FIG. 8, a first modification example of substrate (substrate 2A) included in the light detector 1 will be described. As shown in FIG. 8, the substrate 2A is different from the substrate 2 in that an antireflection film 4 and an antireflection film 5 are further provided, and is the same as the substrate 2 in other respects.

The antireflection film 4 is provided in the non-forming region R3 (a region corresponding to the opening 3a) of the light incident surface 2a (here, a surface 22b of the glass substrate 22). The antireflection film 4 plays a role of suppressing reflection loss of incident light at the interface between the light incident surface 2a and the external environment (air). The antireflection film 4 can be formed by, for example, single-layer AR coating on the surface 22b of the glass substrate 22. According to the antireflection film 4, transmissivity of light passing through the non-forming region R3 can be suitably improved. Accordingly, it is possible to effectively improve light focusing efficiency to the light receiving area 10.

The refractive index n and the film thickness $d_{AR}$ of the antireflection film 4 can be set based on the refractive index of each medium disposed on both sides of the antireflection film 4. In particular, the refraction index $n_{AR}$ of the antireflection film 4 has a value between the refraction index $n_{Air}$ of air and the refraction index $n_{SiO2}$ of the glass substrate 22 (SiO$_2$). That is, the following Equation (6) is established. More preferably, from the viewpoint of widening the wavelength band in which reflection can be suppressed, the refractive index $n_{AR}$ of the antireflection film 4 may be set based on the following Equation (7). The film thickness $d_{AR}$ of the antireflection film 4 is set based on the following Equation (8). Here, λ represents the wavelength of light to be analyzed, and in represents an arbitrary integer of 1 or more.

$$n_{Air} < n_{AR} < n_{SiO2} \qquad \text{(Equation 6)}$$

$$n_{AR} = (n_{Air} \cdot n_{SiO2})^{1/2} \qquad \text{(Equation 7)}$$

$$d_{AR} = (2m+1)\lambda / 4n_{AR} \qquad \text{(Equation 8)}$$

The antireflection film 5 is provided between the silicon substrate 21 and the glass substrate 22 (in the present embodiment, between the silicon substrate 21 and the adhesive resin layer 23). The antireflection film 5 plays a role of suppressing reflection loss of incident light at the interface between the silicon substrate 21 and the glass substrate 22. The antireflection film 5 can be formed by, for example, single-layer AR coating on the back surface 21b of the silicon substrate 21. According to the antireflection film 5, the transmissivity of light passing through the interface between the silicon substrate 21 and the glass substrate 22 can be suitably improved. Accordingly, it is possible to effectively improve light focusing efficiency to the light receiving area 10. The refractive index and the film thickness of the antireflection film 5 can also be set based on the refractive index of each medium disposed on both sides of the antireflection film 5, similarly to the antireflection film 4.

Although a configuration including both the antireflection film 4 and the antireflection film 5 has been described here as an example, only one of the antireflection film 4 and the antireflection film 5 may be provided. In addition, the antireflection film 5 may be provided between the adhesive resin layer 23 and the glass substrate 22. In addition, an antireflection film may be provided each of between the silicon substrate 21 and the adhesive resin layer 23 and between the adhesive resin layer 23 and the glass substrate 22.

[Second Modification Example of Substrate]

With reference to FIG. 9, a second modification example of substrate (substrate 2B) included in the light detector 1 will be described. As shown in FIG. 9, the substrate 2B is different from the substrate 2 in that it further includes a meta-lens layer 6, and is the same as the substrate 2 in other respects.

The meta-lens layer 6 is provided between the silicon substrate 21 and the glass substrate 22 (in the present embodiment, between the silicon substrate 21 and the adhesive resin layer 23). The meta-lens layer 6 has a fine concave-convex structure (for example, a structure in which a plurality of pillars 31 are periodically arranged) similar to that of the above-described meta-lens 3, and serves to further focus light traveling from the glass substrate 22 side to the silicon substrate 21 side into the light receiving area 10. Accordingly, it is possible to effectively improve light focusing efficiency to the light receiving area 10. In the substrate 2B, an antireflection film 4 similar to that in the substrate 2A may be further provided.

[Third Modification Example of Substrate]

With reference to FIG. 10, a third modified example of substrate (substrate 2C) included in the light detector 1 will be described. As shown in FIG. 10, the substrate 2C is different from the substrate 2 in that the substrate 2C is formed of a single substrate member (silicon substrate 21) and the light incident surface substrate 2a is formed by a back surface 21b of the silicon substrate 21, and is the same as the substrate 2 in other respects. That is, the light detector 1 including the substrate 2C is a back-illuminated type light receiving sensor, and has a configuration in which the meta-lens 3 is formed on an incident surface (back surface 21b) of the light receiving sensor. According to the above configuration, by omitting the second substrate (glass substrate 22) included in the substrate 2, it is possible to obtain the same effect of improving the light focusing efficiency as that of the substrate 2 described above while simplifying the structure of the light detector 1. In the substrate 2C, an antireflection film 4 similar to that in the substrate 2A may be further provided.

[Other Modifications of Substrate]

The substrate 2 has a structure in which the first substrate (silicon substrate 21) and the second substrate (glass substrate 22) are joined, but the combination of the first substrate and the second substrate is not limited to the example described above. For example, as the second substrate, a silicon substrate similar to the first substrate may be used instead of the glass substrate 22. Further, in this case, the first substrate and the second substrate (that is, the silicon substrate) may be directly bonded to each other without using the adhesive resin layer 23.

[First Modification Example of Basic Configuration of Meta-Lens]

With reference to FIG. 11, a first modification example (unit cell C2) of the basic configuration (unit lattice) of the meta-lens 3 will be described. The unit cell C2 is formed by an inorganic material layer 32 formed on the surface 22b of the glass substrate 22. In the inorganic material layer 32, one columnar hole 32a (concave portion) is formed for each unit cell C2 (in the embodiment, as an example, a cylindrical shape). The hole 32a penetrates from the upper surface 32b of the inorganic material layer 32 (the surface opposite to the surface in contact with the surface 22b) to the surface 22b of the glass substrate 22 in the central portion of the unit cell C2. The inorganic material layer 32 is formed of, for example, a material similar to that of the pillar 31. The meta-lens 3 may have a hole structure in which unit cells C2 are periodically arranged in a lattice shape, instead of the pillar structure in which the unit cells C1 are periodically arranged in a lattice shape.

When the unit cell C2 is adopted as the basic configuration of the meta-lens 3, the pitch a of the hole 32a (i.e., the center-to-center distance between adjacent holes 32a, the length of one side of the unit cell C2) is set to be shorter than the wave length of the light to be analyzed, as in the case where the unit cell C1 is adopted. As an example, when the wave length λ, of the light to be analyzed is 940 nm, the pitch a of the hole 32a is set to 400 nm, for example. The height h of the hole 32a (the depth of the concave portion) can be selected from the range of 300 nm to 400 nm, for example. The width d (diameter) of the hole 32a can be selected from the range of 100 nm to 300 nm, for example. As an example, in the entire meta-lens 3 (that is, all the unit cells C2), the heights h of the holes 32a are set to a constant value (for example, 500 nm). On the other hand, the width d of the hole 32a of each unit cell C2 is selected from the above-described range according to the arrangement location of each unit cell C2. In this way, by setting the width d of the hole 32a of each unit cell 32a according to the location of each unit cell C2, the amount of phase modulation is controlled for each location of each unit cell C2, and the meta-lens 3 that functions as a condenser lens is obtained. For example, when viewed from the Z-axis direction, the meta-lens 3 has a structure in which a plurality of regions for one cycle (regions including a plurality of unit cells C2), which are formed such that the phase continuously changes by $2\pi$ along a direction from the outside of the meta-lens 3 toward the center (center of the non-forming region R3), are repeatedly arranged along the direction.

When the unit cell C2 is adopted as the basic configuration of the meta-lens 3, that is, when the meta-lens 3 is configured by a plurality of holes 32a (concave portions) periodically arranged, the meta-lens 3 may have a physically stronger structure than when the meta-lens 3 is configured by the pillar structure (a plurality of unit cells C1).

[Second Modification Example of Basic Configuration of Meta-Lens]

With reference to FIG. 12, a second modification example (unit cell C3) of the basic configuration (unit lattice) of the meta-lens 3 will be described. The unit cell C3 is different from the unit cell C2 in that the hole 32a is filled with dielectric 33, and is the same as the unit cell C2 in other respects. The dielectric 33 is, for example, $Al_2O_3$, $SiO_2$, SiN, $HfO_2$, or the like. As shown in FIG. 12, the dielectric 33 may be filled in the hole 32a of each unit cell C3 and may also be deposited on the upper surface 32b of the inorganic material layer 32. The distance from the upper surface 32b of the inorganic material layer 32 to the upper surface 33a of the dielectric 33 (i.e., the height of the dielectric 33 deposited on the inorganic material layer 32) is, for example, about the 150 nm.

When the unit cell C3 is adopted as the basic configuration of the meta-lens 3, the meta-lens can be made to have a physically robust structure more effectively. That is, since the dielectric 33 is provided, the structure can be made physically stronger than the unit cell C2. Further, by embedding the dielectric 33 in the hole 32a, the reflectivity of the meta-lens 3 can be reduced. Accordingly, it is possible to further improve light focusing efficiency to the light receiving area.

An example of a process of manufacturing the meta-lens 3 including the unit cells C2 and C3 of the first modification example and the second modification example will be described with reference to FIG. 13. First, a silicon layer 30 (amorphous silicon) including a portion to be the inorganic material layer 32 is formed on the surface 22b of the glass substrate 22 (quartz substrate) by a sputtering method (step S11). The thickness of the silicon layer 30 may be selected from the range of 300 nm to 400 nm, for example. Subsequently, an electron-beam (EB) resist 100 having a thickness of about 300 nm is applied onto the front side of the silicon layer 30 (the side opposite to the glass substrate 22 side) (step S12). Subsequently, a pattern designed in advance is EB drawn on the EB resist 100 by the EB lithography method (step S13). In detail, openings 100a corresponding to the non-forming region R3 and the hole 32a among unit cells C2 and C3 included in the adjacent region R1 and the peripheral region R2 are formed in the EB resist 100. In the present embodiment (example of FIG. 1), the EB drawing region is a rectangular region having a short side of 20 μm and a long side of 201.5 μm. Subsequently, etching (for example, dry etching such as inductively coupled plasma (ICP-RIE) etching) using the EB resist 100 as a mask is performed to remove a portion (that is, an exposed portion) of the silicon layer 30 corresponding to the opening 100a of the EB resist 100. Thereafter, the EB resist 100 is stripped (step S14). By the processing up to this point, the meta-lens 3 having the unit cell C2 as a basic configuration is formed on the surface 22b of the glass substrate 22. When the meta-lens 3 having the unit cell C3 as a basic configuration is formed, the following processing is further executed. That is, the dielectric 33 is formed (deposited) in the hole 32a and on the inorganic material layer 32 by the atom layer deposition method (ALD) (step S15). When the ALD is performed, the non-forming region R3 is masked so that the dielectric 33 is not formed on the non-forming region R3. By the above processing, the meta-lens 3 having the unit cell C3 as a basic configuration is formed on the surface 22b of the glass substrate 22.

[Other Modifications]

Although one embodiment of the present disclosure has been described above, the present disclosure is not limited to the above embodiment. The material and shape of each component are not limited to those described above, and various materials and shapes may be employed. For example, as illustrated in (A) to (D) of FIG. 14, the shape of the substrate, the shape of the light receiving area, and the shape of the region in which the meta-lens is formed are not limited to those in the above embodiment.

In the light detector 1A of the first modification example shown in (A) of FIG. 14, a meta-lens 3A (a pair of meta-lenses 3A1 and 3A2) is formed in regions on both sides of the light receiving area 10 in the longitudinal direction (Y-axis direction) of the substrate 2. In other words, the meta-lens is not formed in regions on both sides of the central portion (region corresponding to the non-forming region R3) of the light receiving area 10 in the lateral direction (X-axis direction) of the substrate 2. The meta-lens 3A is formed to overlap a first peripheral region R21 and a second peripheral region R22 facing each other in the Y-axis direction among the peripheral region R2. Even with such a configuration, it is possible to improve the light focusing efficiency one-dimensionally at least in the longitudinal direction (Y-axis direction) of the substrate 2. In addition, in the light detector 1A, the meta-lens 3A may be formed in only one region of both regions interposing the light receiving area 10 in the longitudinal direction of the substrate 2. In other words, one of the meta-lenses 3A1 and 3A2 may be omitted. According to this configuration as well, the above-described effects are exhibited with respect to the peripheral region R2 on the side on which the meta-lens 3A is formed.

In the light detector 1B of the second modification example illustrated in (B) of FIG. 14, a meta-lens 3B (a pair of meta-lenses 3B1 and 3B2) is formed in regions on both sides of the light receiving area 10 in the lateral direction (X-axis direction) of the substrate 2. In other words, the meta-lens is not formed on both sides of the central portion of the light receiving area 10 (corresponding to the non-forming region R3) in the longitudinal direction (Y-axis direction) of the substrate 2. The meta-lens 3B is formed to overlap a first peripheral region R21 and a second peripheral region R22 facing each other in the X-axis direction among the peripheral region R2. Even with such a configuration, it is possible to improve the light focusing efficiency one-dimensionally at least in the lateral direction (X-axis direction) of the substrate 2. In addition, in the light detector 1B, the meta-lens 3B may be formed in only one region of both regions interposing the light receiving area 10 in the lateral direction of the substrate 2. In other words, one of the meta-lenses 3B1 and 3B2 may be omitted. According to this configuration as well, the above-described effects are exhibited with respect to the peripheral region R2 on the side on which the meta-lens 3B is formed.

The light detector 1C of the third modification example shown in (C) of FIG. 14 has a square plate-shaped substrate 2C. The light detector 1D of the fourth modification example shown in (D) of FIG. 14 is shorter than the substrate 2 and longer than the substrate 2C. As described above, the substrate included in the light detector may be formed in various shapes.

Further, the light detector 1C has a circular light receiving area 10C and a meta-lens 3C having a shape corresponding to the shape of the light receiving area 10C. That is, the meta-lens 3C has a circular opening 3a that is slightly smaller than the light receiving area 10C so as not to overlap with the central portion of the circular light receiving area 10C. The light detector 1D has an elliptical light receiving area 10D having a minor axis in the X-axis direction and a major axis in the Y-axis direction, and also has a meta-lens 3D having a shape corresponding to the shape of the light receiving area 10D. That is, the meta-lens 3D has an elliptical opening 3a that is slightly smaller than the light receiving area 10D so as not to overlap with the central portion of the elliptical light receiving area 10D. As described above, the light receiving area included in the light detector may be formed in various shapes. In addition, the shape of the area where the meta-lens is formed may be formed in various shapes according to the shape of the light receiving area.

REFERENCE SIGNS LIST 1, 1A, 1B, 1C, 1D: light detector, 2, 2A, 2B, 2C: substrate, 2a: light incident surface, 3, 3A, 3A1, 3A2, 3B, 3B1, 3B2, 3C, 3D: meta-lens, 4, 5: antireflection film, 6: meta-lens layer, 10, 10C, 10D: light receiving area, 21: silicon substrate (first substrate), 21a: main surface (first surface), 21b: back surface (second surface), 22: glass substrate (second substrate), 22b: surface, 23: adhesive resin layer, 31: pillar (convex portion), 32a: hole (concave portion), 33: dielectric, R1: adjacent region, R2: peripheral region, R3: non-forming region, R21: first peripheral region, R22: second peripheral region.

The invention claimed is:

1. A light detector comprising:
a substrate including at least one light receiving area and a light incident surface on which light is incident; and
a meta-lens formed on the light incident surface of the substrate so as to focus the light incident on the light incident surface, wherein
the meta-lens is a nanostructure in which unit cells are periodically arranged,
when viewed from a thickness direction of the substrate, the meta-lens is formed to overlap both an adjacent region adjacent to the light receiving area and a peripheral region that is continuous with the adjacent region and is a region inside the light receiving area along an outer edge of the light receiving area, and
when viewed from the thickness direction, a non-forming region in which the meta-lens is not formed is provided in a region overlapping a central region of the light receiving area in the light incident surface.

2. The light detector according to claim 1, wherein the meta-lens is configured by a plurality of convex portions periodically arranged.

3. The light detector according to claim 1, wherein the meta-lens is configured by a plurality of concave portions periodically arranged.

4. The light detector according to claim 3, wherein each of the plurality of concave portions is filled with a dielectric.

5. The light detector according to claim 1, wherein the meta-lens is formed to overlap at least a first peripheral region and a second peripheral region facing each other in one direction perpendicular to the thickness direction among the peripheral region.

6. The light detector according to claim 1, wherein the meta-lens is formed to overlap an entire annular peripheral region formed over an entire circumference of the light receiving area.

7. The light detector according to claim 1, wherein a width of the non-forming region is set in a range in which a main lobe of light incident on the non-forming region is included in the light receiving area, based on a spread width due to diffraction of the light incident on the non-forming region.

8. The light detector according to claim 1, wherein an antireflection film is provided in the non-forming region.

9. The light detector according to claim 1, wherein the substrate includes:
a first substrate having a first surface provided with the light receiving area and a second surface opposite to the first surface; and
a second substrate bonded to the second surface of the first substrate via an adhesive resin layer and supporting the first substrate, and
the light incident surface is constituted by a surface located on an opposite side of the first substrate in the second substrate.

10. The light detector according to claim 9, wherein the first substrate is a silicon substrate, and the second substrate is a glass substrate.

11. The light detector according to claim 9, wherein an antireflection film is provided between the first substrate and the second substrate.

12. The light detector according to claim 9, wherein a meta-lens layer is provided between the first substrate and the second substrate.

13. The light detector according to claim 1, wherein the substrate is formed of a single substrate member having a first surface provided with the light receiving area and a second surface opposite to the first surface, and
the light incident surface is constituted by the second surface.

* * * * *